(12) United States Patent
Kuwana et al.

(10) Patent No.: US 11,862,631 B2
(45) Date of Patent: Jan. 2, 2024

(54) RADIATION RESISTANT CIRCUIT DEVICE, PRESSURE TRANSMISSION DEVICE, AND NUCLEAR POWER PLANT MEASUREMENT SYSTEM

(71) Applicant: Hitachi, Ltd., Tokyo (JP)

(72) Inventors: Ryo Kuwana, Tokyo (JP); Masahiro Masunaga, Tokyo (JP); Mutsumi Suzuki, Tokyo (JP); Isao Hara, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 800 days.

(21) Appl. No.: 16/937,061

(22) Filed: Jul. 23, 2020

(65) Prior Publication Data

US 2021/0050348 A1 Feb. 18, 2021

(30) Foreign Application Priority Data

Aug. 13, 2019 (JP) .................. 2019-148311

(51) Int. Cl.
*H01L 27/088* (2006.01)
*G01L 9/00* (2006.01)
(Continued)

(52) U.S. Cl.
CPC .......... *H01L 27/088* (2013.01); *G01L 9/0042* (2013.01); *G21C 17/00* (2013.01);
(Continued)

(58) Field of Classification Search
CPC .................. H01L 29/1608; H01L 2924/10272
See application file for complete search history.

(56) References Cited

U.S. PATENT DOCUMENTS 5,834,832 A 11/1998 Kweon et al.
11,349,000 B2 * 5/2022 Masunaga ........... H01L 29/0638
(Continued)

FOREIGN PATENT DOCUMENTS

CN 1377311 A * 10/2002
JP 2007220888 A * 8/2007
(Continued)

OTHER PUBLICATIONS

Japanese-language Office Action issued in Japanese Application No. 2019-148311 dated Jan. 10, 2023 with English translation (six (6) pages).
(Continued)

*Primary Examiner* — Ryan D Walsh
(74) *Attorney, Agent, or Firm* — Crowell & Moring LLP

(57) ABSTRACT

Provided is a SiC semiconductor element equipped with a SiC integrated circuit having a stable characteristic, which operates normally even in a radiation environment. A radiation resistant circuit device includes: a SiC semiconductor element equipped with a SiC integrated circuit, a printed board on which the SiC semiconductor element is provided, a conductive wiring that is arranged inside the printed board and has a predetermined surface facing a bottom surface of a substrate electrode of the SiC integrated circuit, and an insulating material arranged between the bottom surface of the substrate electrode of the SiC integrated circuit and the predetermined surface of the conductive wiring.

28 Claims, 7 Drawing Sheets

(51) Int. Cl.
*G21C 17/00* (2006.01)
*H01L 23/498* (2006.01)
*H01L 23/00* (2006.01)
*H01L 29/16* (2006.01)

(52) U.S. Cl.
CPC ........ *H01L 23/49838* (2013.01); *H01L 24/48* (2013.01); *H01L 29/1608* (2013.01); *H01L 2224/48227* (2013.01); *H01L 2924/10272* (2013.01); *H01L 2924/1424* (2013.01)

(56) References Cited

U.S. PATENT DOCUMENTS

| | | | |
|---|---|---|---|
| 2007/0262387 A1* | 11/2007 | Nonaka | H01L 23/057 257/E23.106 |
| 2014/0225241 A1 | 8/2014 | Chiang et al. | |
| 2017/0098631 A1 | 4/2017 | Kikuchi et al. | |

FOREIGN PATENT DOCUMENTS

| | | | |
|---|---|---|---|
| JP | 2015068647 A | * | 4/2015 |
| JP | 2017-69480 A | | 4/2017 |
| JP | 2017204524 A | * | 11/2017 |
| JP | 2018-206934 A | | 12/2018 |
| JP | 2019-86314 A | | 6/2019 |
| JP | 2019-92388 A | | 6/2019 |
| JP | 2023031429 A | * | 3/2023 |

OTHER PUBLICATIONS

Ohshima, T et al., "Radiation Response of Silicon Carbide Diodes and Transistors", Physics and Technology of Silicon Carbide Devices, Chapter 16, Austria, Oct. 16, Intech Open, 2012, pp. 379-402 (25 pages).

Japanese-language Office Action issued in Japanese Application No. 2019-148311 dated Oct. 4, 2022 with English translation (14 pages).

Extended European Search Report issued in European Application No. 20189985.3 dated Dec. 17, 2020 (nine (9) pages).

Tanaka Y. et al., "700-V 1.0-mΩ • $cm^2$ Buried Gate SiC-SIT (SiC-BGSIT)", IEEE Electron Device Letters, Nov. 2006, pp. 908-910, vol. 27, No. 11 (three (3) pages).

* cited by examiner

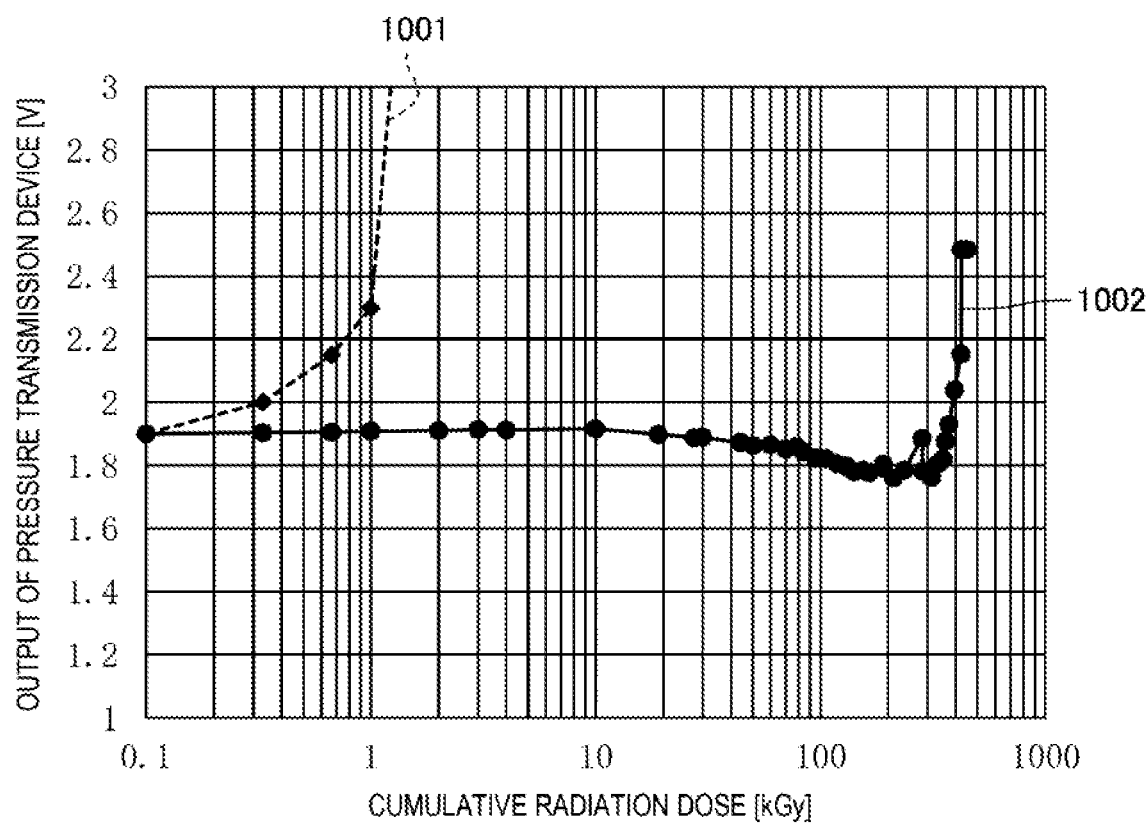

RADIATION RESISTANT CIRCUIT DEVICE, PRESSURE TRANSMISSION DEVICE, AND NUCLEAR POWER PLANT MEASUREMENT SYSTEM

CROSS-REFERENCE TO RELATED APPLICATIONS

The present application claims priority under 35 U. S. C. § 119 to Japanese Patent Application No. 2019-148311, filed on Aug. 13, 2019. The contents of this application are incorporated herein by reference in their entirety.

BACKGROUND OF THE INVENTION

1. Field of the Invention

The present invention relates to a radiation resistant circuit device, a pressure transmission device using the same, and a nuclear power plant measurement system.

2. Description of the Related Art

In a nuclear plant and a radiation utilization facility, a plurality of measuring instruments are installed in order to measure processes of the plant and the facility. These measuring instruments are provided with a circuit including a semiconductor element. Among elements forming the circuit, the semiconductor element is generally considered to be vulnerable to radiation. When the semiconductor element is irradiated with the radiation (gamma rays), electrons and holes are generated in an oxide film of the semiconductor element. Since a mobility of the electrons in the oxide film is smaller than that in a conductor, the electrons and the holes do not recombine and increase in accordance with an irradiation dose of the radiation. Although the electrons in the oxide film escape from the oxide film since the electrons have a higher mobility than the holes, the holes may accumulate in the oxide film as positive charges since the holes have a low mobility.

Although an effect is small as long as a dose rate of the radiation is low, in a severe environment such as an accident at the nuclear plant, the effect is also large since the dose rate is also high.

That is, as long as in a case of a measuring instrument to which the semiconductor element (in particular, an integrated circuit) is applied, there is a possibility that an indicated value may drift or, in the worst case, a measurement may be impossible.

Therefore, a countermeasure such as shielding with lead or the like, or setting a distance from a radiation source is taken for the measuring instrument irradiated with the radiation. Another countermeasure is to use a semiconductor material that is resistant to the radiation.

Specifically, a silicon carbide (hereinafter referred to as SiC) that is used in a power semiconductor in recent years is a typical semiconductor material that has a wide band gap and is resistant to radiation. At present, although a silicon (hereinafter referred to as Si) material is used for the integrated circuit, it is expected that radiation resistance is greatly improved by using the silicon material as the SiC.

On the other hand, a semiconductor such as the SiC having the wide band gap has a problem of being difficult to form the integrated circuit. In particular, since a SiC wafer is mainly used for the power semiconductor, a p-type substrate suitable for forming the integrated circuit is not used. Therefore, when the SiC is operated as the integrated circuit such as an operational amplifier, a drive voltage is applied to a substrate potential (a bottom of an element).

Since a general-purpose substrate of a Si integrated circuit is the p-type substrate, the substrate is set to a GND potential. In contrast, since a general-purpose substrate of a SiC integrated circuit is an n-type substrate, the substrate cannot be connected to the GND potential. This is because that when the n-type substrate is set to the GND potential (a negative potential), a current may flow in a parasitic PN junction diode.

Since the substrate (n-type substrate) cannot be set to the GND potential in the SiC integrated circuit manufactured by the n-type substrate as in the above configuration, characteristics of the integrated circuit may change due to an effect of the drive voltage. Since this problem is newly discovered, it is found that countermeasures are necessary to ensure a stable operation.

Related arts related to such a SiC semiconductor include JP-A-2018-206934 (PTL 1) and 700-V 1.0-mΩ cm^2 buried gate SiC-SIT (SiC-BGSIT); Y. Tanaka et al., IEEE EDL, 27, No. 11, 2006 (NPL 1).

[Abstract] of PTL 1 discloses that "In a silicon carbide semiconductor device exposed to a high-radiation environment, by preventing a deterioration of an isolation performance of an element isolation layer due to an exposure to γ rays, high reliability of the silicon carbide semiconductor device can be maintained for a long period of time. A semiconductor element 1 formed on a main surface of a semiconductor substrate 2, an element isolation layer 3 formed on the main surface of the semiconductor substrate 2 and surrounding a periphery of the semiconductor element 1 in a plan view, and a conductor portion 5 formed directly above the element isolation layer 3 with an insulating layer 4 interposed therebetween and electrically connected to the element isolation layer 3 are formed." and discloses a technique of the silicon carbide semiconductor device.

In addition, NPL 1 discloses a technique of a SiC power device.

In the technique disclosed in the above PTL 1, countermeasures are shown for the problem of element isolation in the silicon carbide semiconductor device exposed to the high-radiation environment, but no countermeasures against noise are shown, so that there is a problem that noise countermeasures are insufficient.

In addition, since the SiC power device disclosed in NPL 1 is a SiC power semiconductor that uses a large current, although the large current flows in a vertical direction of the element and a bottom of the substrate is a high voltage, the drive voltage is extremely small compared to the high voltage and an effect on an operation can be ignored, so that the substrate potential can be used without a concern. In contrast, when using the SiC as the integrated circuit, there is a problem that the fluctuation of the drive voltage to be applied to the substrate potential affects the characteristics of the integrated circuit.

SUMMARY OF THE INVENTION

An object (task) to be attained by the invention is to provide a SiC semiconductor element equipped with a SiC integrated circuit having a stable characteristic, which operates normally even in a radiation environment.

In order to attain the above object, the invention is configured as follows.

That is, a radiation resistant circuit device of the invention includes: a SiC semiconductor element equipped with a SiC integrated circuit; a printed board on which the SiC semiconductor element is provided; a conductive wiring arranged inside the printed board and having a predetermined surface facing a bottom surface of a substrate electrode of the SiC integrated circuit; and an insulating material arranged between the bottom surface of the substrate electrode of the SiC integrated circuit and the predetermined surface of the conductive wiring.

In addition, other means will be described in modes for carrying out the invention.

According to the invention, it is possible to provide a SiC semiconductor element equipped with a SiC integrated circuit having a stable characteristic, which operates normally even in a radiation environment.

BRIEF DESCRIPTION OF THE DRAWINGS

FIG. 6 is a diagram showing an example of a result of a gamma ray irradiation test in the pressure transmission device to which the radiation resistant circuit device is applied according to the third embodiment of the invention.

DESCRIPTION OF THE PREFERRED EMBODIMENTS

Hereinafter, modes for carrying out the invention (hereinafter referred to as "embodiments") will be described with reference to the drawings as appropriate.

First Embodiment: Radiation Resistant Circuit Device

A radiation resistant circuit device 1A according to a first embodiment of the invention will be described with reference to FIGS. 1 and 3B.

Figure 1:
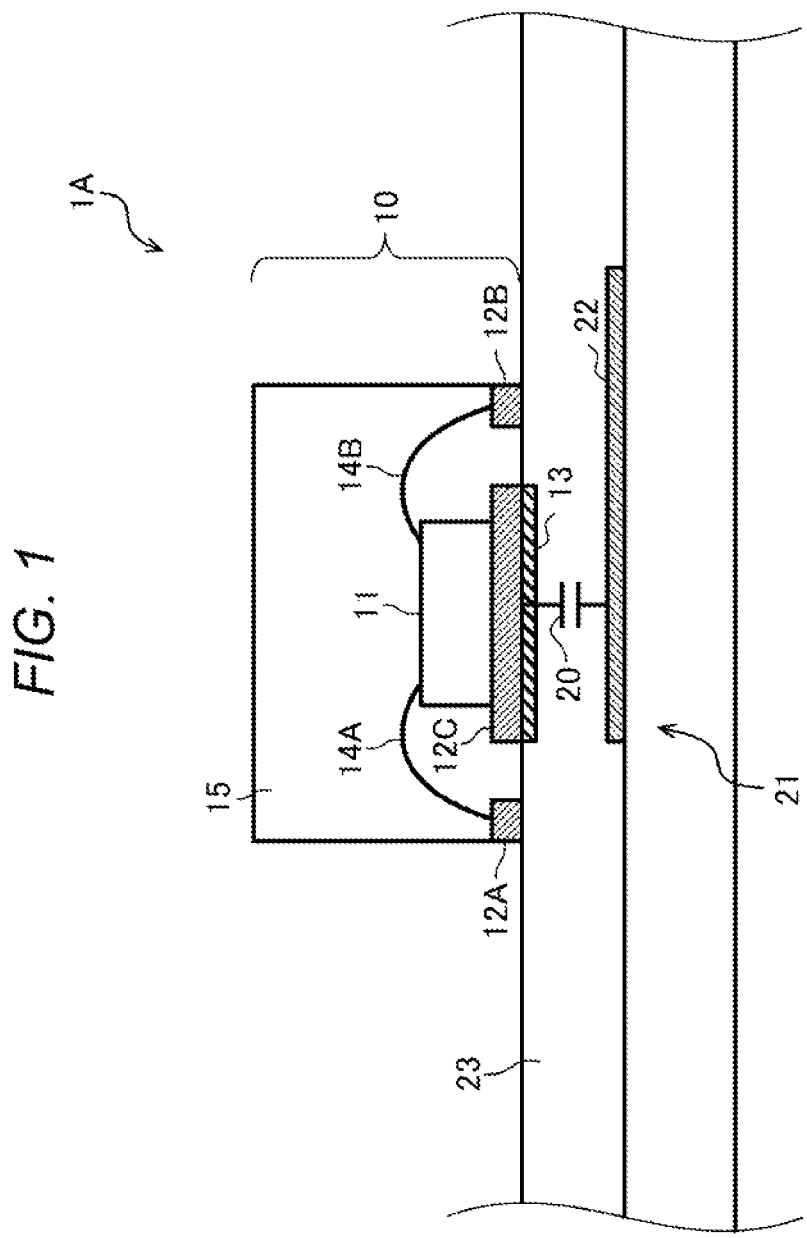
FIG. 1 is a diagram showing a configuration example of a cross section of a radiation resistant circuit device according to a first embodiment of the invention.

FIG. 1 is a diagram showing a configuration example of a cross section of the radiation resistant circuit device 1A according to the first embodiment of the invention.

In FIG. 1, the radiation resistant circuit device 1A includes a SiC semiconductor element 10, a printed board 21, and an insulating material 13.

A conductive wiring 22 and a covering material 23 are constituent elements provided in the printed board 21 in the present embodiment as to be described later. In addition, a SiC integrated circuit 11 is a constituent element provided in the SiC semiconductor element 10 in the present embodiment as to be described later.

<<SiC Semiconductor Element 10>>

In FIG. 1, in a portion shown in a cross section, the SiC semiconductor element 10 includes the SiC integrated circuit 11, electrodes (Cu electrodes) 12A, 12B and 12C, wire bondings 14A and 14B, and a molding resin 15. However, the SiC semiconductor element 10 also includes a plurality of electrodes and wire bondings in a portion that is not shown.

The SiC integrated circuit 11 includes an operational amplifier of an analog circuit, a logic circuit, or the like, using SiC (silicon carbide) that is resistant to radiation or a high temperature.

Although a metal oxide semiconductor field effect transistor (MOSFET) is also used for the SiC integrated circuit 11, in a case of configuring the operational amplifier of the analog circuit, when a bipolar transistor, a diode, or a resistor, a capacitor, and a wiring are mainly used, a resistance to the radiation is extremely strong.

In addition, terminals of the SiC integrated circuit 11 are electrically connected to the electrodes 12A and 12B of the SiC semiconductor element 10 by the wire bondings 14A and 14B. The electrode (substrate electrode) 12C of a substrate in FIG. 1 is connected to a positive power supply (Vdd) potential electrode (not shown) of the SiC semiconductor element 10 by a wire bonding (not shown).

Then, the SiC integrated circuit 11 and the electrodes 12A, 12B and 12C are shielded by the molding resin 15.

The SiC semiconductor element 10 is an electronic component equipped on the printed board 21 by adopting the above configuration.

<<Printed Board 21>>

The printed board 21 includes a plurality of layer configurations, and on a front surface or a back surface thereof, the above SiC semiconductor element 10 or various electronic components (not shown) are equipped. In addition, a plurality of wirings are provided in a plurality of layers inside the printed board 21, and configure circuit wirings together with wirings passing through through holes to interlayers, the front surface or the back surface.

In FIG. 1, the SiC semiconductor element 10 is provided on the front surface of the printed board 21, and the conductive wiring 22 is provided below the SiC semiconductor element 10 with the insulating material 13 (insulating means) and the covering material 23 interposed therebetween.

At least a part of the conductive wiring 22 is provided directly below the SiC integrated circuit 11 that is equipped on the SiC semiconductor element 10. Therefore, a bottom surface of the electrode (the substrate electrode) 12C of the substrate of the SiC integrated circuit 11 and a part of an upper surface (a predetermined surface) of the conductive wiring 22 face each other.

In addition, the conductive wiring 22 is, for example, connected to a wiring of a fixed voltage (for example, the Vdd or a negative power supply potential Vss) such as a power supply wiring.

In addition, as described above, the insulating material 13 is provided directly below the SiC integrated circuit 11. Accordingly, between the bottom surface of the electrode (the substrate electrode) 12C of the substrate forming the SiC integrated circuit 11 and the part of the upper surface (the predetermined surface) of the conductive wiring 22 of the printed board 21, a parasitic capacitance (a parasitic electrostatic capacitance) 20 having a large value is formed via the insulating material 13 and the covering material 23.

As the insulating material 13, for example, a resin material, a rubber material, or the like is used.

<<Parasitic Capacitance and Noise Resistance>>

According to the above configuration, the electrode 12C of the substrate connected to the Vdd of the SiC integrated circuit 11 and the conductive wiring 22 to which a fixed potential (for example, the Vdd) is supplied are coupled via the insulating material 13 and the covering material 23 with the parasitic capacitance (the parasitic electrostatic capacitance) 20 having the large value, so that a potential of the substrate (the electrode 12C) of the SiC integrated circuit 11 is stabilized.

Therefore, an operation of the SiC integrated circuit 11 (the SiC semiconductor element 10) against noise or drift in a radiation environment is stabilized.

In the configuration of FIG. 1, it is desirable that the conductive wiring 22 is the wiring of the fixed voltage such as the power supply wiring as described above. Further, it is desirable that the conductive wiring 22 is the wiring of the positive power supply potential (the Vdd).

The reasons are that the parasitic capacitance between the conductive wiring 22 and a bottom of the SiC integrated circuit 11 (the SiC semiconductor element 10) is stabilized and can be easily secured to a predetermined value, and that since the power supply wiring is generally less affected by the noise, a drive voltage applied to the SiC integrated circuit 11 (the SiC semiconductor element 10) can be more stabilized.

Overview of First Embodiment

The radiation resistant circuit device 1A of the first embodiment uses the SiC integrated circuit 11 that is resistant to the radiation.

Further, by forming the parasitic capacitance (the parasitic electrostatic capacitance) 20 having the large value, the potential of the substrate forming the SiC integrated circuit 11 is stabilized. Therefore, the SiC integrated circuit 11 and the SiC semiconductor element 10 operate stably even with respect to radiation irradiation, or noise generated by the operation of the SiC integrated circuit 11, or turning on/off of power supply of other devices.

That is, the SiC integrated circuit 11 and the SiC semiconductor element 10 reduce characteristic deterioration caused by the radiation irradiation, output an accurate value even when the SiC semiconductor element 10, a circuit using the same, and a measuring instrument are irradiated with the radiation, and operate normally even in the radiation environment.

Since the analog circuit such as the operational amplifier (not shown) in the SiC integrated circuit 11 is also easily affected by drift or weak noise caused by the radiation irradiation during the operation, the above noise countermeasures are particularly effective for the SiC integrated circuit 11 including the analog circuit.

Although the SiC integrated circuit 11 uses the SiC as an element, an n-type substrate is generally used as a SiC substrate. Therefore, it is difficult to obtain a SiC p-type substrate. In such a situation, an effect of a stable operation obtained by the configuration including the large value of parasitic capacitance 20 is important.

The stable operation of the SiC integrated circuit 11 against this noise will be described in detail later with reference to FIGS. 3A and 3B.

Modification 1 of First Embodiment

FIG. 1 shows an example in which the conductive wiring 22 connected to the wiring of the fixed voltage is arranged such that the predetermined surface of the upper surface thereof is directly below the entire bottom surface of the electrode (the substrate electrode) 12C of the substrate of the SiC integrated circuit 11. In other words, an example is shown in which the entire area of the electrode (the substrate electrode) 12C of the substrate is accommodated within a region of the conductive wiring 22 in a plan view. However, even when the predetermined surface of the upper surface of the conductive wiring 22 is only arranged so as to be directly below a part of the bottom surface of the electrode (the substrate electrode) 12C of the substrate of the SiC integrated circuit 11, an effect of reducing the noise is obtained.

Modification 2 of First Embodiment

As described above, FIG. 1 shows the example in which the conductive wiring 22 connected to the wiring of the fixed voltage is arranged such that the predetermined surface of the upper surface thereof is directly below the entire bottom surface of the electrode (the substrate electrode) 12C of the substrate of the SiC integrated circuit 11. However, when the conductive wiring 22 is arranged so as to be directly below the entire SiC semiconductor element 10, that is, when all the constituent elements of the SiC semiconductor element 10 are accommodated within the region of the conductive wiring 22 in a plan view, there is a possibility that not only the noise of the SiC integrated circuit 11 is further reduced, but also the noise of each component and wiring of the SiC semiconductor element 10 is reduced.

Effect of First Embodiment

With the configuration in which the parasitic capacitance 20 having the large value is provided between the substrate forming the SiC integrated circuit 11 and the predetermined surface of the upper surface of the conductive wiring 22 of the printed board 21 via the insulating material 13 and the covering material 23, an effect may be obtained that the SiC integrated circuit 11 and the SiC semiconductor element 10 operate stably with resistance with respect to noise or drift caused by operation of the SiC integrated circuit 11 and generated in the radiation irradiation or during the operation.

Second Embodiment: Radiation Resistant Circuit Device

Next, a radiation resistant circuit device 1B according to a second embodiment of the invention will be described with reference to FIG. 2.

Figure 2:
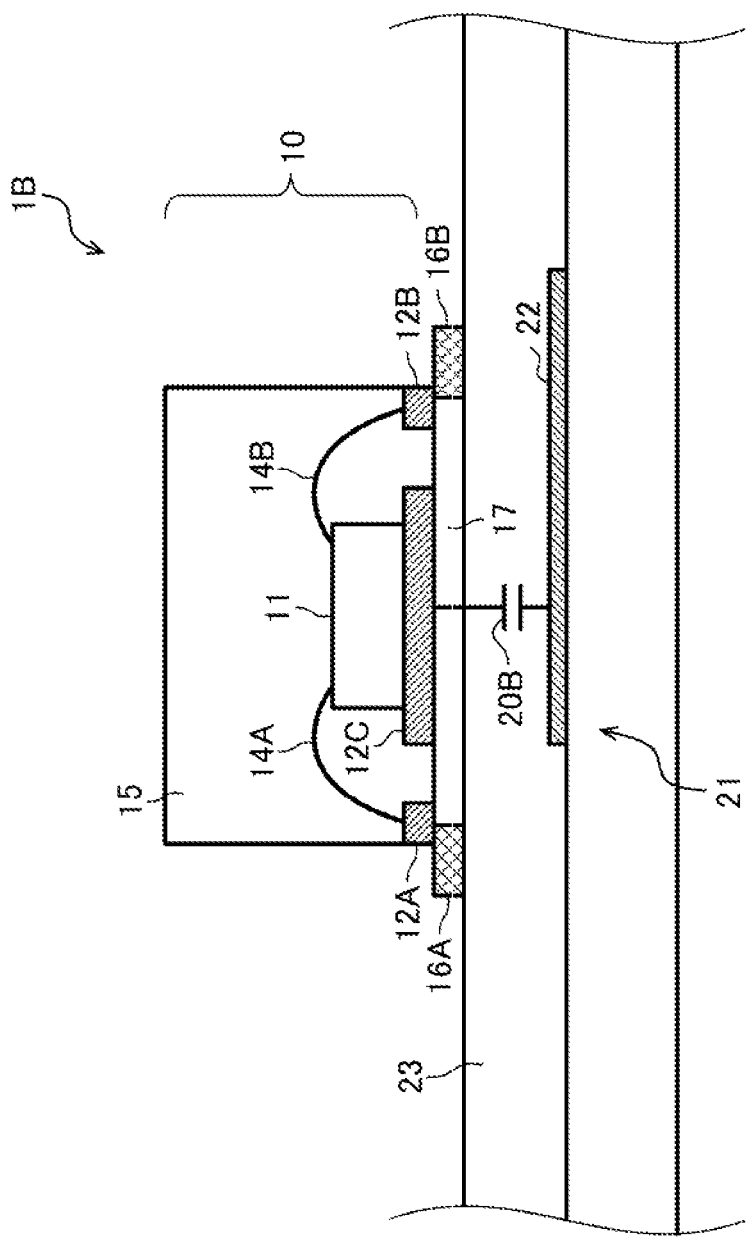
FIG. 2 is a diagram showing a configuration example of a cross section of a radiation resistant circuit device according to a second embodiment of the invention.

FIG. 2 is a diagram showing a configuration example of a cross section of the radiation resistant circuit device 1B according to the second embodiment of the invention.

In FIG. 2, the radiation resistant circuit device 1B includes the SiC semiconductor element 10, the printed board 21, and second metal electrodes (solders) 16A and 16B, and a space 17.

The printed board 21 includes a plurality of layer configurations, as in FIG. 1 in the first embodiment, on the front surface or the back surface, the SiC semiconductor element 10 and various electronic components (not shown) are equipped, but since the SiC semiconductor element 10 and the electronic components are not directly related to the noise under the radiation which is the problem to be solved by the invention, descriptions thereof are omitted.

In FIG. 2, the second metal electrodes 16A and 16B are provided in order to connect the electrodes 12A and 12B and an electric wiring of the printed board 21.

By providing the second metal electrodes 16A and 16B, the space 17 is formed between the electrode 12C of the substrate of the SiC integrated circuit 11 and the printed board 21.

A function of the space 17 (insulation means) in FIG. 2 is electrical isolation, which is the same as the insulating material 13 in FIG. 1.

According to the above configuration, the bottom surface of the electrode (the substrate electrode) 12C of the substrate of the SiC integrated circuit 11 and a part of the upper surface (the predetermined surface) of the conductive wiring 22 face each other.

In addition, the conductive wiring 22 is, for example, connected to a wiring of a fixed voltage (for example, Vdd or Vss) such as a power supply wiring.

In addition, as described above, the space 17 is provided directly below the SiC integrated circuit 11.

According to the configuration, between the bottom surface of the electrode (the substrate electrode) 12C of the substrate forming the SiC integrated circuit 11 and the part of the upper surface (the predetermined surface) of the conductive wiring 22 of the printed board 21, a parasitic capacitance (a parasitic electrostatic capacitance) 20B having a large value is formed via the space 17 and the covering material 23.

By forming the parasitic capacitance 20B between the electrode (the substrate electrode) 12C of the substrate forming the SiC integrated circuit 11 and the conductive wiring 22 connected to the fixed voltage such as the power supply wiring, the SiC integrated circuit 11 and the SiC semiconductor element 10 operate stably even with respect to the radiation irradiation, or noise generated by the operation of the SiC integrated circuit 11, and turning on/off of the power supply of the other devices.

Since a distance in the space 17 between the electrode 12C of the substrate and the printed board 21 (the covering material 23) has a trade-off relationship between an insulating property and a capacitance value of the parasitic capacitance 20B, the distance is appropriately determined according to a situation of a manufacturing process.

In addition, the electrode 12C, which is the substrate electrode, may also be sealed with the molding resin, but it is desirable to use a metal electrode in consideration of heat dissipation.

Effect of Second Embodiment

The radiation resistant circuit device 1B according to the second embodiment of the invention does not use the insulating material 13 (FIG. 1) of the first embodiment, which may contribute to a cost reduction or a process reduction.

In addition, the radiation resistant circuit device 1B according to the second embodiment of the invention is similar to the radiation resistant circuit device 1A according to the first embodiment, and due to the operation of the SiC integrated circuit 11 and has an effect that the SiC integrated circuit 11 and the SiC semiconductor element 10 operate stably with resistance with respect to noise or drift caused by operation of the SiC integrated circuit 11 and generated in the radiation irradiation or during the operation.

<Substrates in SiC Integrated Circuit and Si Integrated Circuit>

Substrates in the SiC integrated circuit and Si integrated circuit will be described with reference to FIGS. 3A and 3B.

<<Substrate in Si Integrated Circuit>>

Figure 3A:
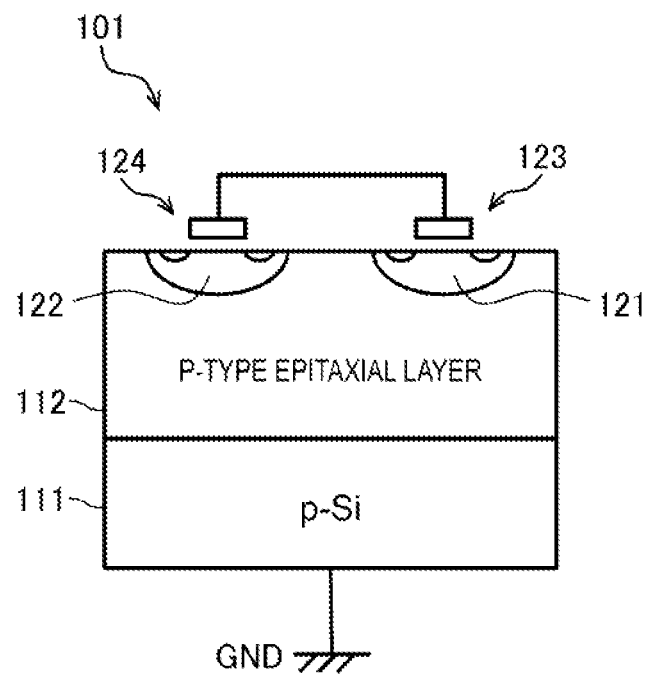
FIG. 3A is a diagram showing a structural example of a cross section including a substrate in a Si integrated circuit.

FIG. 3A is a diagram showing a structural example of a cross section including a substrate in a Si integrated circuit 101.

In the Si integrated circuit 101 of a Si semiconductor shown in FIG. 3A, a p substrate has been widely used. That is, as an integrated circuit using the Si (silicon), the p substrate is versatile and can be easily procured.

In FIG. 3A, in the Si integrated circuit 101, a substrate 111 is formed by the p substrate (p-Si) which is a p-type semiconductor, and a p-type epitaxial layer 112 is formed thereon.

Then, an n-well (121) and a p-well (122) are provided in an upper layer portion of the p-type epitaxial layer 112.

In addition, a p-type MOSFET 123 is formed on the n-well (121), and a drain electrode and a source electrode located below a gate electrode of the p-type MOSFET 123 are provided in the n-well (121).

In addition, an n-type MOSFET 124 is formed on the p-well (122), and a drain electrode and a source electrode located below a gate electrode of the n-type MOSFET 124 are provided in the p-well (122).

Then, a complementary MOS (CMOS) circuit configured by such as the p-type MOSFET 123 made of the Si, the n-type MOSFET 124 made of the Si, or the Si integrated circuit 101 including a plurality of MOSFETs is configured.

Although not shown in FIG. 3A, the Si integrated circuit 101 may include a diode, a bipolar transistor, a capacitor, a resistance element, a wiring, or the like.

In FIG. 3A, since the substrate 111 is formed by the p-type semiconductor, the p-type substrate 111 is connected to a GND potential which is a negative potential so that a parasitic diode does not conduct. That is, a substrate potential of the Si integrated circuit 101, which is an IC of a p-type substrate, is GND.

<<Substrate in SiC Integrated Circuit>>

Figure 3B:
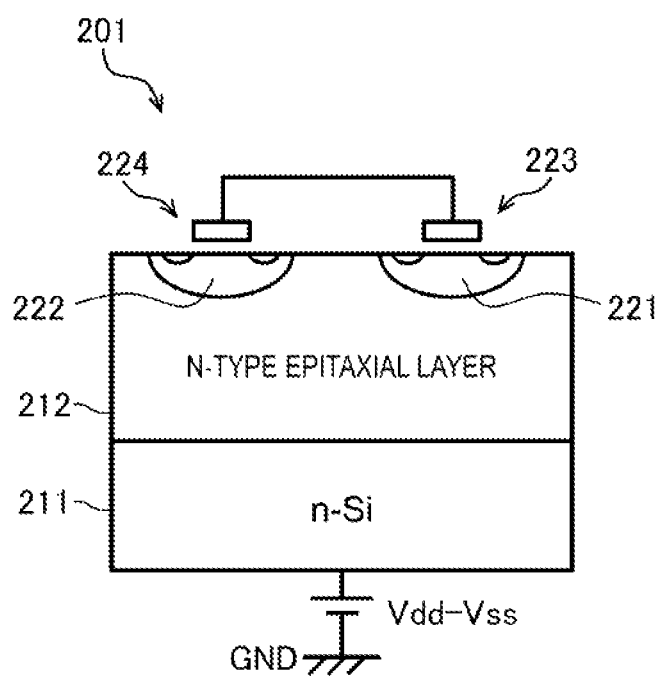
FIG. 3B is a diagram showing a structural example of a cross section including a substrate in a SiC integrated circuit.

FIG. 3B is a diagram showing a structural example of a cross section including a substrate in a SiC integrated circuit 201.

The SiC integrated circuit 201 in FIG. 3B uses an n substrate. Since the SiC is generally used as a power semiconductor, the n substrate occupies most of usage, and it is generally difficult to procure the p substrate.

Therefore, in the SiC integrated circuit 201 of FIG. 3B, a substrate 211 is formed by the n substrate (n-Si) which is an n-type semiconductor, and an n-type epitaxial layer 212 is formed thereon.

Then, an n-well (221) and a p-well (222) are provided in an upper layer portion of the n-type epitaxial layer 212.

In addition, a p-type MOSFET 223 is formed on the n-well (221), and a drain electrode and a source electrode located below a gate electrode of the p-type MOSFET 223 are provided in the n-well (221).

In addition, an n-type MOSFET 224 is formed on the p-well (222), and a drain electrode and a source electrode located below a gate electrode of the n-type MOSFET 224 are provided in the p-well (222).

Then, a CMOS circuit configured by such as the p-type MOSFET 223 made of the SiC, the n-type MOSFET 224 made of the SiC, or the SiC integrated circuit 201 including a plurality of MOSFETs is configured.

Although not shown in FIG. 3B, the SiC integrated circuit 201 may include a diode, a bipolar transistor, a capacitor, a resistance element, a wiring, or the like.

As described above, in the SiC integrated circuit 201, since the substrate (the n substrate) 211 is formed by the n-type semiconductor, the negative potential (the Vss) serving as the GND cannot be set on the substrate (the n substrate) 211. That is, it is because that when the negative potential (the Vss) is supplied to the n substrate, a parasitic diode in the SiC integrated circuit 201 is set to a forward direction and a current flows through.

Therefore, it is necessary to apply the Vdd, which is the positive power source potential to the n-type substrate 211 so that the parasitic diode does not conduct. Therefore, with the negative power supply potential being set to the Vss, the Vdd potential is applied to the n-type substrate 211 with respect to the GND via a potential of Vdd-Vss corresponding to the drive voltage.

When the operational amplifier of the analog circuit is used in the SiC integrated circuit 201, a +Vdd power supply and a −Vss power supply may be used with respect to the GND with the GND interposed therebetween. In addition, the −Vss power supply may be simply connected to the GND for use. Since there are two cases, a voltage applied between the GND and the substrate 211 is represented as (Vdd-Vss) in FIG. 3B.

For example, when ±4V as a power supply voltage is applied to a SiC operational amplifier, the drive voltage is 8V. In this case, in FIG. 3B, the GND potential may be set to 0V and may be set to −4V. A voltage represented by Vdd-Vss is applied from the GND to the n-type substrate 211 so that the two cases can also be represented.

However, as compared with a case where the substrate (the p substrate) 111 having the Vss potential is set to the GND (FIG. 3A), when the substrate (the n substrate) 211 having the Vdd potential is not directly connected to the GND, characteristics of the SiC integrated circuit 201 are easily affected by fluctuation of the drive voltage.

As described above, in a configuration of the SiC integrated circuit 201 of FIG. 3B, when the drive voltage (Vdd-Vss) fluctuates due to an effect of the radiation irradiation, external noise such as turning on/off of other devices, IC characteristics of each element in the SiC integrated circuit 201 may also change.

That is, the SiC integrated circuit 201 in which the Vdd potential is applied to the n-type substrate 211 is more easily affected by the radiation irradiation or the external noise as compared with the Si integrated circuit 101, so that a countermeasure is necessary.

<<Operation Stabilization of SiC Integrated Circuit 201>>

Therefore, as in the first embodiment (FIG. 1) and the second embodiment (FIG. 2) described above, by providing the conductive wiring 22 directly below the SiC integrated circuit 201 and forming the parasitic capacitance 20 between the electrode 12C of the substrate of the SiC integrated circuit 201 and the conductive wiring 22, the effect of radiation irradiation or external noise such as turning on/off of other devices is reduced. Then, the fluctuation of the drive voltage (Vdd-Vss) of the SiC integrated circuit 201 is prevented and the stable operation is obtained.

Third Embodiment: Pressure Transmission Device

Next, a pressure transmission device including the radiation resistant circuit device according to the first or second embodiment in an amplifier circuit will be described as a third embodiment.

Figure 4:
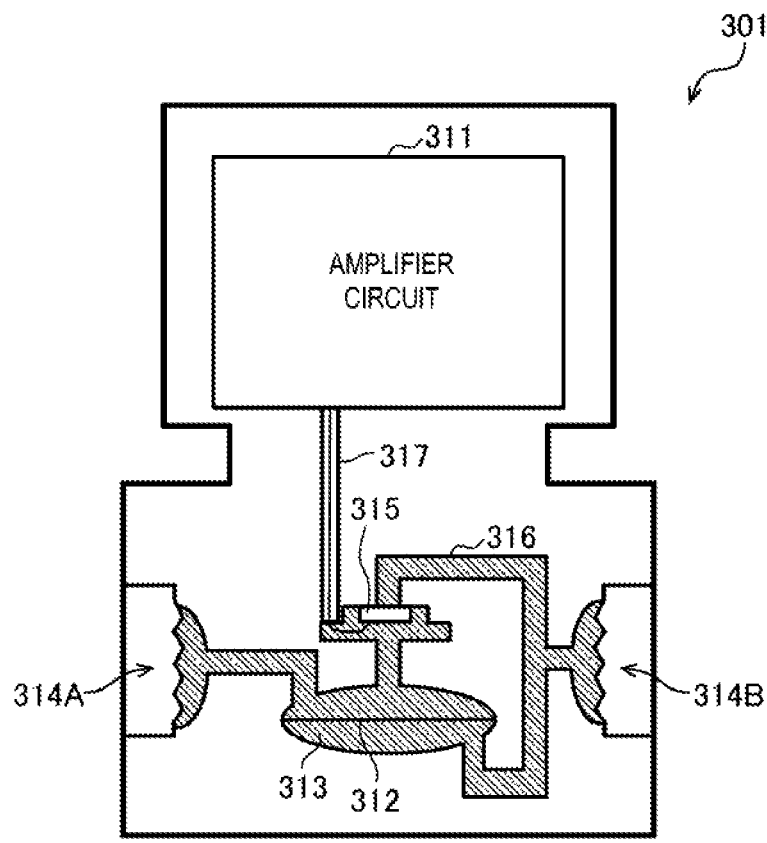
FIG. 4 is a diagram showing a configuration example of a pressure transmission device according to a third embodiment of the invention.

FIG. 4 is a diagram showing a configuration example of a pressure transmission device 301 according to the third embodiment of the invention.

In FIG. 4, the pressure transmission device 301 includes an amplifier circuit 311, a center diaphragm 312, seal diaphragms 314A and 314B, a pressure sensor 315, and a pressure guide passage 316.

The pressure transmission device 301 transmits a pressure to the pressure sensor 315 by a sealed liquid (silicone oil) 313 inside the pressure guide passage 316 by a pair of two seal diaphragms 314A and 314B for receiving the pressure and the center diaphragm. 312. The seal diaphragm 314A is on a high pressure side, and the seal diaphragm 314B is on a low pressure side.

Then, a pressure signal is sent to the amplifier circuit 311 through a signal line 317, and an amplified output signal is output from the pressure transmission device 301.

In a configuration of FIG. 4, the amplifier circuit 311 is an electric circuit including a semiconductor element, and a product in the related art uses a Si semiconductor element, and thus is relatively vulnerable to the radiation. Therefore, it is effective to apply a semiconductor that is resistant to the radiation such as the SiC.

Further, when the SiC integrated circuit (11) adopts a structure such as the SiC semiconductor elements (1A, 1B) as shown in FIGS. 1 and 2, then, a semiconductor element or an integrated circuit that is resistant to the radiation can be obtained.

<Amplifier Circuit>

Next, the amplifier circuit 311 provided in the pressure transmission device 301 of the third embodiment will be described in detail with reference to FIG. 5.

Figure 5:
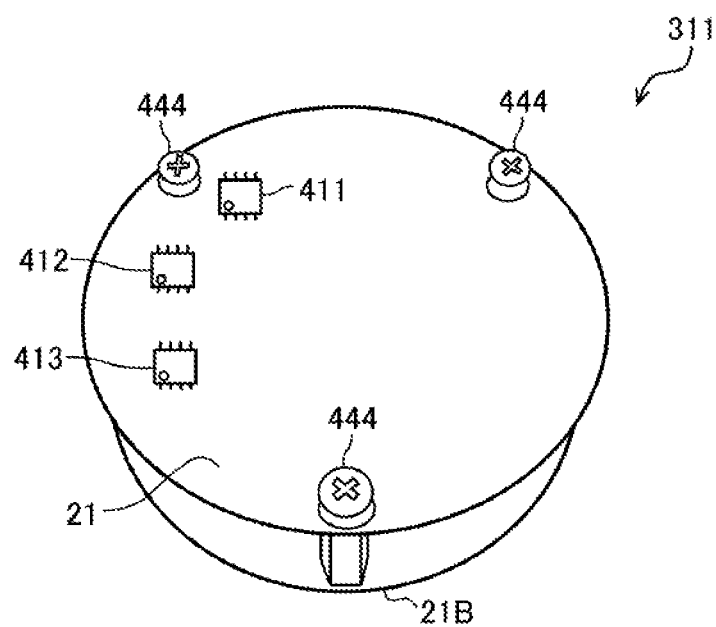
FIG. 5 is a diagram showing a configuration example of an amplifier circuit provided in the pressure transmission device according to the third embodiment of the invention.

FIG. 5 is a diagram showing a configuration example of the amplifier circuit 311 provided in the pressure transmission device 301 according to the third embodiment of the invention.

In FIG. 5, the amplifier circuit 311 includes printed boards 21 and 21B, bolts 444, a SiC operational amplifier (a SiC integrated circuit) 411, and SiC integrated circuits 412 and 413. The SiC integrated circuits 412 and 413 may also be SiC operational amplifiers.

As shown in FIG. 5, the amplifier circuit 311 includes a configuration in which the SiC integrated circuits (411 to 413) and other various elements (not shown) are provided on the printed board 21.

The printed board 21B is also provided with circuits corresponding to the SiC semiconductor elements (411 to 413).

As described above, it is expected that radiation resistance is greatly improved by replacing the Si semiconductor element that is relatively vulnerable to the radiation with the SiC semiconductor element.

However, when the SiC integrated circuit is provided without any countermeasures, a performance of the integrated circuit itself is deteriorated by the external noise such as wraparound from a front surface of the printed board as described above.

In a configuration of the amplifier circuit 311 including a plurality of SiC integrated circuits (411 to 413) shown in FIG. 5, by providing pseudo capacitances (20, 20B) formed by the insulating means (13, 17) described in the first and second embodiments of the invention and the conductive wiring 22 (FIG. 1) provided in the printed board, the effect of the radiation and the external noise is reduced, and stable operation and measurement of the pressure transmission device 301 can be provided.

<Result of Gamma Ray Irradiation Test>

FIG. 6 is a diagram showing an example of a result of a gamma ray irradiation test in the pressure transmission device 301 to which the radiation resistant circuit device 1A is applied according to the third embodiment of the invention.

In FIG. 6, a vertical axis represents an output of the pressure transmission device, and a unit of the output is voltage [V]. A horizontal axis represents a cumulative radiation dose of gamma rays, and a unit of the cumulative radiation dose is [kGy]. The horizontal axis is logarithmic display.

In FIG. 6, a characteristic line 1001 indicates characteristics of a related-art product (a Si transmitter) using the Si semiconductor element equipped with the integrated circuit made of Si (the Si integrated circuit).

A characteristic line 1002 indicates characteristics of the pressure transmission device (the SiC transmitter) 301 of the invention using the SiC semiconductor element (1A) having a configuration in which the SiC integrated circuit (11) having the configuration shown in FIG. 1 is used and the insulating material (13) is provided between the substrate electrode (12C) and the conductive wiring (22).

Since the Si transmitter (the pressure transmission device) of the related-art product uses an element made of Si that is relatively vulnerable to radiation, as indicated by the characteristic line 1001, a measured value drifts from a start of gamma ray irradiation, and drifts greatly near a cumulative value exceeding 1 kGy, leading to a failure.

On the other hand, it is experimentally shown that, as indicated by the characteristic line 1002, the pressure transmission device (the SiC transmission device) 301 to which a SiC element of the invention is applied almost has no fluctuation in output from irradiation to about 30 kGy, and can operate up to about 450 kGy which largely exceeds that of the Si transmitter (the pressure transmission device) of the related-art product.

From a test result shown in FIG. 6, it can be seen that by applying the radiation resistant circuit device 1A according to the embodiment of the invention, it is possible to provide a measuring instrument having excellent radiation resistance.

Effect of Third Embodiment

By applying the radiation resistant circuit device 1A according to the first embodiment of the invention to the pressure transmission device 301 according to the third embodiment, it is possible to provide the measuring instrument having excellent radiation resistance.

In addition, a highly reliable system can be provided since stable measurement can be performed not only during normal measurement, but also during a severe accident when a radiation dose greatly increases.

Fourth Embodiment: Nuclear Power Plant Measurement System

Next, an outline of a system configuration of a nuclear power plant measurement system will be described with reference to FIGS. 7A and 7B.

Figure 7A:
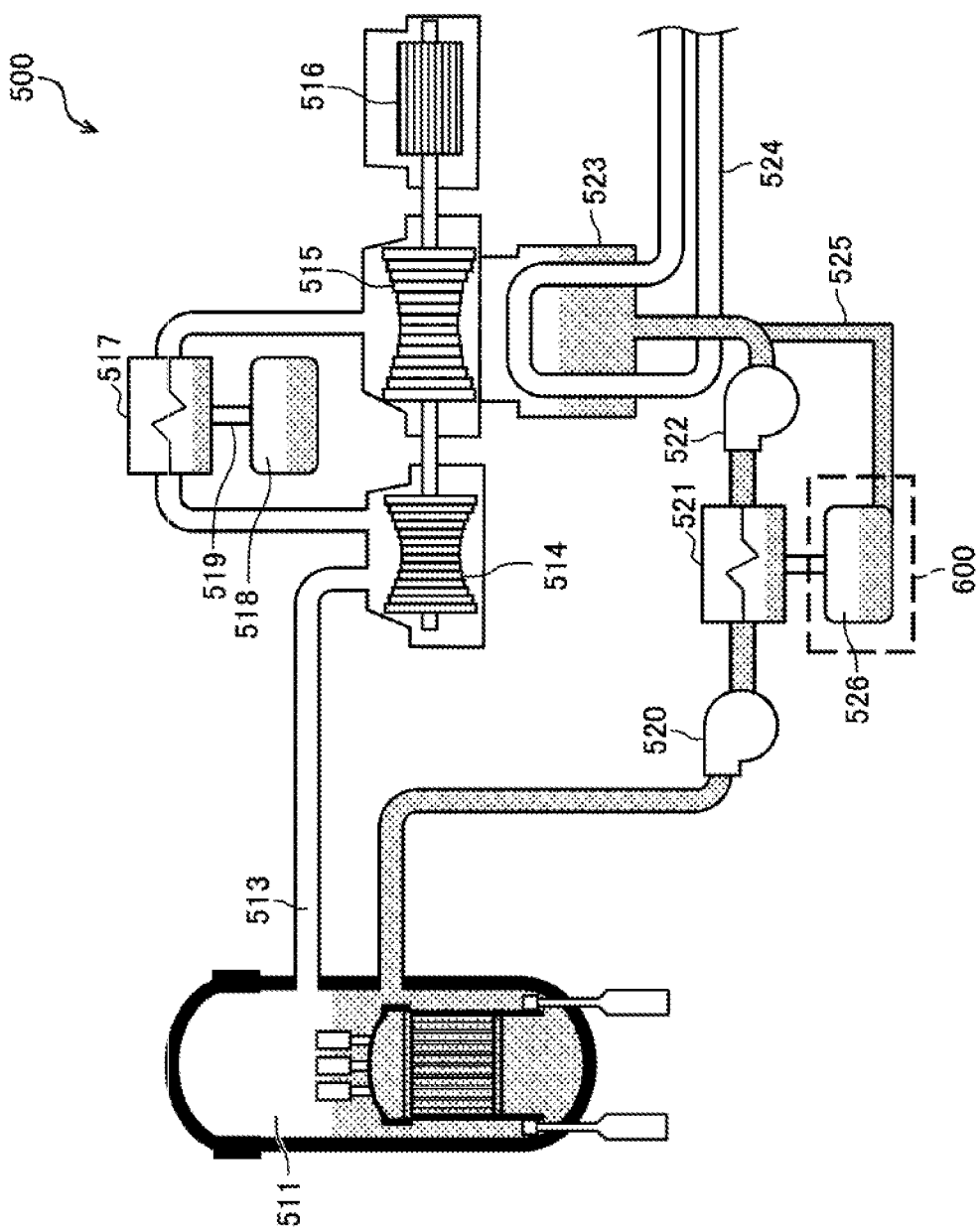
FIG. 7A is a diagram showing an outline of a system configuration example of a nuclear power plant measurement system according to a fourth embodiment of the invention.

FIG. 7A is a diagram showing an outline of a system configuration example of the nuclear power plant measurement system according to a fourth embodiment of the invention.

Figure 7B:
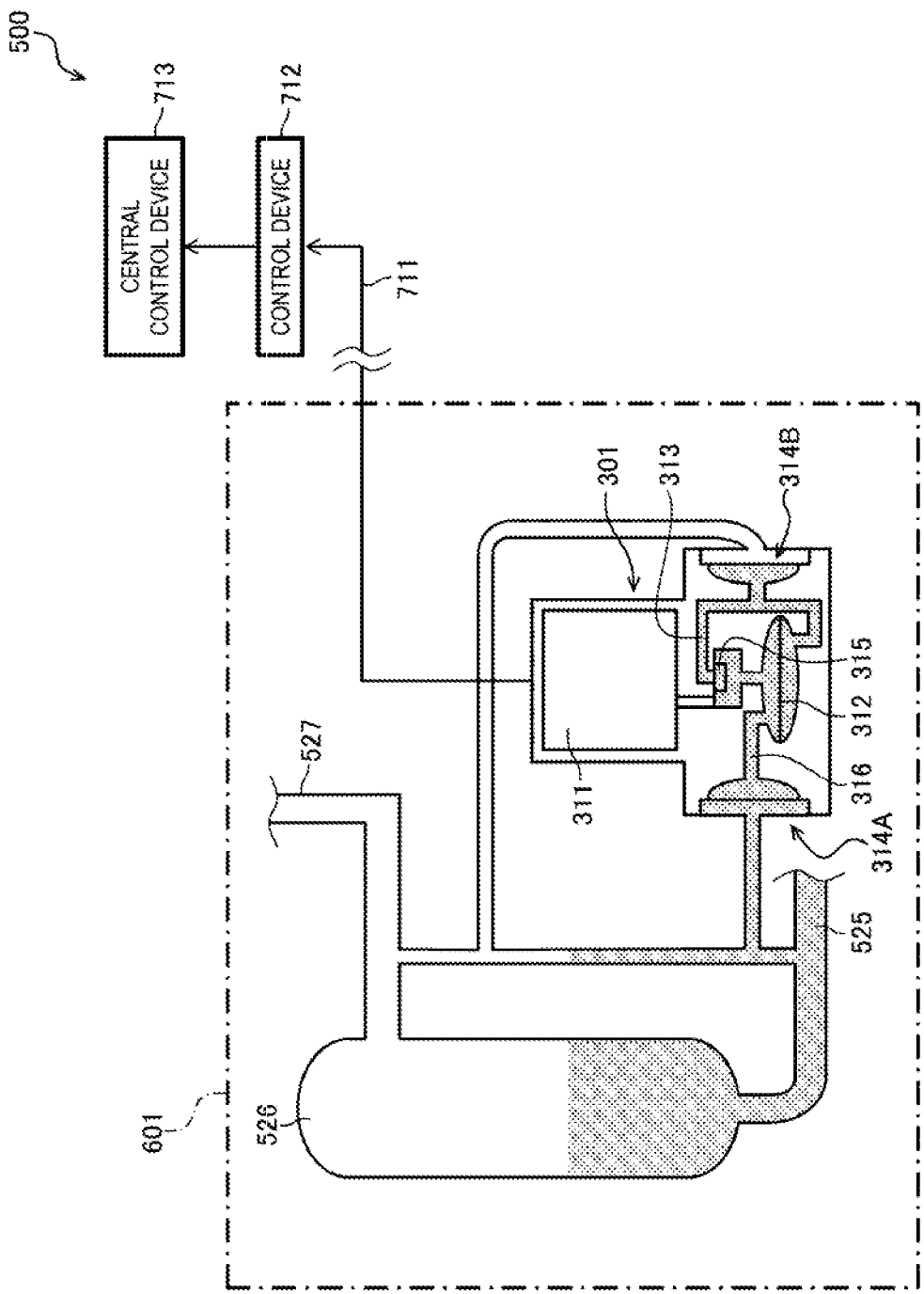
FIG. 7B is a diagram showing a configuration example of a vicinity of a drain tank and a pressure transmission device of the nuclear power plant measurement system according to the fourth embodiment of the invention in an enlarged view, together with a control device.

FIG. 7B is a diagram showing a configuration example of a vicinity of a drain tank and a pressure transmission device of the nuclear power plant measurement system according to the fourth embodiment of the invention in an enlarged view, together with a control device.

In FIGS. 7A and 7B, a nuclear power plant measurement system 500 includes a pressure vessel 511, a main steam pipe 513, a high pressure turbine 514, a low pressure turbine 515, a generator 516, a moisture separator and heater 517, a drain tank 518, a drainpipe 519, a water supply pump 520, and a water supply heater 521, a condensate pump 522, a condenser 523, a cooling water pipe 524, a water supply pipe 525, a drain tank 526, a control device 712, and a central control device 713.

A region 600 showing a vicinity of the drain tank 526 in FIG. 7A is enlarged and details are shown in a region 601 in FIG. 7B. However, in FIGS. 7A and 7B, for example, a member of the drain tank 526 is deformed and shown.

As shown in FIG. 7B, a configuration of a portion indicated in the region 601 includes the drain tank 526, the water supply pipe 525, the drain pipe 527, and the pressure transmission device 301 described with reference to FIG. 4.

As shown in FIG. 4, the pressure transmission device 301 shown in FIG. 7B includes the amplifier circuit 311, the center diaphragm 312, the sealed liquid 313, the seal diaphragms 314A and 314B, the pressure sensor 315, and the pressure guide passage 316.

The above nuclear power plant measurement system 500 (a nuclear power generation system) shown in FIGS. 7A and 7B is characterized by using the pressure transmission device 301 described in the third embodiment.

Therefore, a detailed description of the nuclear power plant measurement system 500 shown in FIGS. 7A and 7B is omitted, and events and operations related to the pressure transmission device 301 will be briefly described.

In the nuclear power plant measurement system (the nuclear power generation system) 500 shown in FIG. 7B (FIG. 7A), an installation situation of the pressure transmission device 301 used for measuring a water level of the drain tank 526 is shown as an example.

In FIG. 7B, the pressure transmission device 301 includes the tubular pressure guide passage 316 provided at a position where a measurement fluid in a primary system of a nuclear power plant is measured, and the sealed liquid 313 filled in the pressure guide passage.

In addition, the pressure transmission device 301 includes the seal diaphragms 314A and 314B provided in a state of closing one opening in the pressure guide passage 316 and receiving a pressure of the measurement fluid, the center diaphragm 312, and the pressure sensor 315 converting the detected pressure into an electric signal.

In addition, the pressure transmission device 301 includes the amplifier circuit 311 provided with the SiC semiconductor element 10 (FIG. 1) amplifying an output signal of the pressure sensor 315.

In the pressure transmission device 301 including the above configuration, the seal diaphragms 314A and 314B and the center diaphragm 312, which are diaphragms that are membranes displaced under an action of the pressure, receive pressures from a high pressure side and a low pressure side of the drain tank 526 via the sealed liquid 313 filled in the pressure guide passage 316, so that the pressure sensor 315 converts the pressure into a water level and converts the water level into an electric signal.

This electric signal is transmitted by a control line (a signal line) 711 to the central control device (a central control room) 713 via the control device 712 as the measured value.

In FIG. 7B, the radiation dose is high especially when the nuclear power generation system is in operation, and when the same device is used for a long period of time, a radiation deterioration is a concern. In addition, when an accident such as a pipe breakage occurs, the radiation dose around the pressure transmission device greatly increases, so that there is a risk that the pressure transmission device in the related art fails in a short time.

With respect to the radiation that greatly increases, as described above, it is effective to apply the radiation resistant circuit device 1A or 1B to the amplifier circuit 311 of the pressure transmission device 301 of the present application. Accordingly, it is possible to provide a safe and highly reliable measurement system (the nuclear power plant measurement system 500) capable of maintaining measurement error accuracy for a long period of time even in an environment with a high radiation dose such as a water supply system and a condensate system of the nuclear power generation system.

Effect of Fourth Embodiment

Accordingly, it is possible to provide a safe and highly reliable measurement system capable of maintaining a measurement error accuracy for a long period of time even in an environment with a high radiation dose such as the water supply system and the condensate system of the nuclear power generation system by the nuclear power plant measurement system (nuclear power generation system) 500 shown in FIGS. 7A and 7B.

Other Embodiments

The invention is not limited to the embodiments described above, and further includes various modifications. For example, the embodiments described above have been described in detail for easy understanding of the invention, and the invention is not necessarily limited to those including all the configurations described above. In addition, a part of the configuration of one embodiment can be replaced with a part of the configuration of another embodiment, and a part or all of the configuration of one embodiment can be added to, deleted from, and replaced with the configuration of another embodiment.

Hereinafter, other embodiments or modifications will be further described.

<<Electrodes 12A, 12B and 12C>>

Although the electrodes 12A, 12B, and 12C are described as copper (Cu) electrodes in FIG. 1 of the first embodiment and FIG. 2 of the second embodiment, the electrodes are not limited to copper. For example, aluminum, silver, gold, or an alloy may be used.

<<Conductive Wiring 22>>

In FIG. 1 of the first embodiment, the conductive wiring 22 faces the electrode 12C of the substrate of the SiC integrated circuit 11, or it is sufficient as long as the conductive wiring 22 has a portion facing the electrode 12C. Therefore, a shape of the conductive wiring 22 does not need to be exactly the same as a shape of the electrode 12C of the substrate of the SiC integrated circuit 11. The shape of the conductive wiring 22 can be variously set depending on the wiring of the conductive wiring 22 on the printed board 21.

<<Second Metal Electrodes 16A and 16B>>

Although in FIG. 2 of the second embodiment, the "solders" are illustrated as the second metal electrodes 16A and 16B, the second metal electrodes 16A and 16B may be formed of a material other than the "solder" since the second metal electrodes 16A and 16B are provided to separate the SiC semiconductor element 10 from the printed board 21 to form the space 17.

<<Analog Circuit>>

Although it is described that in the SiC integrated circuit in the first embodiment, radiation countermeasures or the noise countermeasures are effective in an example of the operational amplifier serving as the analog circuit, the invention is not limited to the operational amplifier. The noise countermeasures in the present application are also effective with respect to the analog circuit such as an amplifier circuit, a comparison circuit, or an oscillation circuit.

In addition, even in a logic circuit, the radiation countermeasures or the noise countermeasures in the present application are also effective with respect to a circuit having a high clock frequency or a circuit operating at a low voltage.

<<Other Application Examples of Radiation Resistant Circuit Device>>

In the third embodiment of the invention, the pressure transmission device is shown as an application example of the radiation resistant circuit device. However, the application example of the radiation resistant circuit device is not limited to the pressure transmission device. For example, the radiation resistant circuit device can be applied to various devices that may be used in the radiation environment such as a flow meter, various gas detectors, or a preamplifier.

<<Application Example of System>>

In the nuclear power plant measurement system according to the fourth embodiment of the invention, the system configuration that may be affected by the radiation in nuclear power generation is described. However, the invention is not limited to this example. It is possible and effective to use the above radiation resistant circuit device of the invention even in various systems of radiation equipment and facilities under the radiation environment such as a radiation distribution measurement system measuring the radiation.

In addition, although an application example of applying the radiation resistant circuit device to devices or systems related to the nuclear power generation is described, the invention is not limited to those related to the nuclear power generation. The radiation resistant circuit device of the present application is also useful in an environment related to an aerospace (for example, an artificial satellite) as an environment in which the effect of the radiation cannot be ignored.

What is claimed is:

1. A radiation resistant circuit device, comprising:
   a SiC semiconductor element equipped with a SiC integrated circuit;
   a printed board on which the SiC semiconductor element is provided;
   a conductive wiring and a covering material that are arranged inside the printed board, the conductive wiring having a predetermined surface facing a bottom surface of a substrate electrode of the SiC integrated circuit; and
   an insulating material arranged between the bottom surface of the substrate electrode of the SiC integrated circuit and the predetermined surface of the conductive wiring;
   wherein a parasitic capacitance is formed via the insulating material and the covering material between the bottom surface of the substrate electrode of the SiC integrated circuit and the conductive wiring.

2. The radiation resistant circuit device according to claim 1, wherein the predetermined surface of the conductive wiring faces a part of the bottom surface of the substrate electrode of the SiC integrated circuit.

3. The radiation resistant circuit device according to claim 2, wherein
an electronic circuit of the printed board includes an amplifier circuit that amplifies and outputs an electric signal of a pressure of a measurement fluid.

4. The radiation resistant circuit device according to claim 1, wherein
the predetermined surface of the conductive wiring faces the entire bottom surface of the substrate electrode of the SiC integrated circuit.

5. The radiation resistant circuit device according to claim 1, wherein
the conductive wiring is connected to a fixed potential in an electronic circuit of the printed board.

6. The radiation resistant circuit device according to claim 1, wherein
the conductive wiring is connected to a power supply potential in an electronic circuit of the printed board.

7. The radiation resistant circuit device according to claim 6, wherein
the power supply potential is a positive power supply potential.

8. The radiation resistant circuit device according to claim 1, wherein
a substrate of the SiC integrated circuit is an n-type substrate.

9. The radiation resistant circuit device according to claim 1, wherein
the SiC integrated circuit is provided with an analog circuit.

10. The radiation resistant circuit device according to claim 9, wherein
the analog circuit includes an operational amplifier.

11. A pressure transmission device, comprising:
the radiation resistant circuit device according to claim 1.

12. The pressure transmission device according to claim 11, wherein
the pressure transmission device amplifies and outputs a pressure of a measurement fluid by an amplifier circuit including the radiation resistant circuit device.

13. A nuclear power plant measurement system comprising:
the radiation resistant circuit device according to claim 1.

14. The nuclear power plant measurement system according to claim 13, further comprising:
a tubular pressure guide passage provided at a position where a measurement fluid in a primary system of a nuclear power plant is to be measured;
a sealed liquid filled in the pressure guide passage;
a seal diaphragm provided in a state of closing one opening in the pressure guide passage and receiving a pressure of the measurement fluid;
a pressure sensor converting the pressure detected by the seal diaphragm into an electric signal; and
an amplifier circuit amplifying an output signal of the pressure sensor and provided with a SiC semiconductor element.

15. A radiation resistant circuit device, comprising:
a SiC semiconductor element equipped with a SiC integrated circuit;
a printed board on which the SiC semiconductor element is provided; and
a conductive wiring and a covering material that are arranged inside the printed board, the conductive wiring having a predetermined surface facing a bottom surface of a substrate electrode of the SiC integrated circuit, wherein
a space is formed between the bottom surface of the substrate electrode of the SiC integrated circuit and the predetermined surface of the conductive wiring, and
a parasitic capacitance is formed via the space and the covering material between the bottom surface of the substrate electrode of the SiC integrated circuit and the conductive wiring.

16. The radiation resistant circuit device according to claim 15, wherein
the predetermined surface of the conductive wiring faces a part of the bottom surface of the substrate electrode of the SiC integrated circuit.

17. The radiation resistant circuit device according to claim 16, wherein
an electronic circuit of the printed board includes an amplifier circuit that amplifies and outputs an electric signal of a pressure of a measurement fluid.

18. The radiation resistant circuit device according to claim 15, wherein
the predetermined surface of the conductive wiring faces the entire bottom surface of the substrate electrode of the SiC integrated circuit.

19. The radiation resistant circuit device according to claim 15, wherein
the conductive wiring is connected to a fixed potential in an electronic circuit of the printed board.

20. The radiation resistant circuit device according to claim 15, wherein
the conductive wiring is connected to a power supply potential in an electronic circuit of the printed board.

21. The radiation resistant circuit device according to claim 20, wherein
the power supply potential is a positive power supply potential.

22. The radiation resistant circuit device according to claim 15, wherein
a substrate of the SiC integrated circuit is an n-type substrate.

23. The radiation resistant circuit device according to claim 15, wherein
the SiC integrated circuit is provided with an analog circuit.

24. The radiation resistant circuit device according to claim 23, wherein
the analog circuit includes an operational amplifier.

25. A pressure transmission device, comprising:
the radiation resistant circuit device according to claim 15.

26. The pressure transmission device according to claim 25, wherein
the pressure transmission device amplifies and outputs a pressure of a measurement fluid by an amplifier circuit including the radiation resistant circuit device.

27. A nuclear power plant measurement system comprising:
the radiation resistant circuit device according to claim 15.

28. The nuclear power plant measurement system according to claim 27, further comprising:
a tubular pressure guide passage provided at a position where a measurement fluid in a primary system of a nuclear power plant is to be measured;
a sealed liquid filled in the pressure guide passage;

a seal diaphragm provided in a state of closing one opening in the pressure guide passage and receiving a pressure of the measurement fluid;

a pressure sensor converting the pressure detected by the seal diaphragm into an electric signal; and an amplifier circuit amplifying an output signal of the pressure sensor and provided with a SiC semiconductor element.

* * * * *